US006898769B2

(12) United States Patent
Nassif et al.

(10) Patent No.: US 6,898,769 B2
(45) Date of Patent: May 24, 2005

(54) DECOUPLING CAPACITOR SIZING AND PLACEMENT

(75) Inventors: Sani Richard Nassif, Austin, TX (US); Haihua Su, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/268,236

(22) Filed: Oct. 10, 2002

(65) Prior Publication Data

US 2004/0073881 A1 Apr. 15, 2004

(51) Int. Cl.[7] .................................................. G06F 17/50
(52) U.S. Cl. ...................... 716/5; 716/2; 716/8; 716/9; 716/10; 716/11
(58) Field of Search ................................ 716/2, 5, 8–11

(56) References Cited

U.S. PATENT DOCUMENTS

| | | | |
|---|---|---|---|
| 5,587,333 A | | 12/1996 | Johansson |
| 6,232,154 B1 | * | 5/2001 | Reith et al. ................. 438/129 |
| 6,353,248 B1 | * | 3/2002 | Reith et al. ................. 257/369 |
| 6,523,159 B2 | * | 2/2003 | Bernstein et al. ............ 716/10 |
| 2003/0148278 A1 | * | 8/2003 | Lauter et al. ................. 435/6 |

OTHER PUBLICATIONS

Su et al., "Optimal Decoupling Capacitor Sizing and Placement for Standard-Cell Layout Designs," IEEE, Apr. 2003, pp. 428–436.*

Hobbs et al., "Simulataneous Switching Noise Suppression for High Speed Systems Using Embedded Decoupling," IEEE, Jun. 20001, pp. 1–5.*

Zhao et al., "Power Supply Noise Aware Floorplanning and Decoupling Capacitance Placement," Proc. 15th Intl. Conf. VLSI Design, 2002.

Visweswariah et al., "Noise Considerations in Circuit Optimization," IEEE Trans. CAD, vol. 19, No. 6, Jun. 2000.

Su, "Fast Analysis and Optimization of Power/Ground Networks," Intl.Conf. CAD Proc. 2000 pp. 477–482.

* cited by examiner

*Primary Examiner*—Vuthe Siek
(74) *Attorney, Agent, or Firm*—Casimer K. Salys; Jack V. Musgrove

(57) ABSTRACT

A method and system for reducing noise in a power grid of an integrated circuit, which optimizes the placement and sizing of decoupling capacitors in the power grid. Logic cells are located in a first layout of the integrated circuit with empty spaces between the adjacent cells, and the placement of the cells is changed to a second layout wherein the size of the empty spaces between the adjacent cells also change. The decoupling capacitors are placed in the empty spaces of the second layout. In the example of a row-oriented cell structure, the empty spaces may be uniformly distributed along each row for the initial layout. An adjoint sensitivity analysis is performed of the sensitivity of a noise function of the integrated circuit with respect to sizes of the empty spaces between adjacent cells, and an original noise waveform is convolved with an adjoint noise waveform. The convolution may use piecewise linear compressions of the original and adjoint noise waveforms. A quadratic programming solver is then used to iteratively determine the sizes of the empty spaces between adjacent cells.

12 Claims, 6 Drawing Sheets

Before Optimization

DECOUPLING CAPACITOR SIZING AND PLACEMENT

BACKGROUND OF THE INVENTION

1. Field of the Invention

The present invention generally relates to managing noise in a power grid or plane of an electronic device, and more particularly to a method of using decoupling capacitors to reduce noise in an integrated circuit, such as an application specific integrated circuit having rows of random logic macros.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cells types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should be located on the surface of a integrated circuit device. Due to the large number of components and the details required by the fabrication process, physical design is not practical without the aid of computers. As a result, most phases of physical design extensively use computer aided design (CAD) tools, and many phases have already been partially or fully automated. Automation of the physical design process has increased the level of integration, reduced turn around time and enhanced chip performance. A few years ago, pure standard cell designs were typical of many integrated circuits, but today's designs for application specific integrated circuits (ASICs) or field programmable gate arrays (FPGAs) contain large blocks of reserved areas for memory arrays, proprietary (IP) blocks, etc. Consequently, placement now often requires the arrangement of logic around these large blocks.

One problem that has arisen in these modern electronic devices relates to noise in the power grid of the device. Substantial noise is generated in an integrated circuit chip as digital electronic functions are interconnected or decoupled. FIG. 1 is an illustration of the voltage droop at a given node in the power grid ($V_{dd}$) of a typical row-based, ASIC circuit. An efficient metric to estimate power grid induced noise at a node is the integral of the voltage droop below a user-specified noise ceiling $NM_H$. In the example of FIG. 1, this value is 90% of $V_{dd}$, the power supply voltage. The power grid provides the power and ground signals throughout the chip, and these are among the most important signals to control reliably, since supply voltage variations can lead not only to problems related to spurious transitions in some case (particularly when dynamic logic is used), but also to delay variations and timing unpredictability. Even if a reliable supply is provided at an input pin of a chip, it can deteriorate significantly within the chip due to imperfections in the conductors that transmit these signals throughout the chip.

Noise in modern electronic circuits is particularly troublesome as it increases the requirements on the noise margins and other circuit parameters. Noise margins have been greatly reduced in modern designs due to the lowering of supply voltages and the presence of a larger number of potential noise generators. With technology scaling, the trend for high performance integrated circuits is towards ever higher operating frequencies, lower supply voltages, and higher power dissipation. These features cause a dramatic increase in the currents being delivered through the on-chip power grid.

One solution to this problem lies in the use of decoupling capacitors. On-chip decoupling capacitors (also referred to as "decaps"), which are intentionally attached to the power grid, can reduce power-supply induced noise. For example, in a 300 MHz CMOS reduced instruction set computing (RISC) microprocessor design, as much as 160 nF of on-chip decoupling capacitance may be added to control power supply noise. In another example, the on-chip decoupling capacitance may be sized at ten times that of the total active circuit switching capacitance. The closer decoupling capacitors can be placed in relation to the noise source (such as a switching transistor), the more effective the decoupling will be, primarily due to a decreased inductance in series with the decoupling capacitance. Decoupling capacitors may be provided underneath devices at the surface of an integrated circuit, or distributed in a carrier of the chip. U.S. Pat. No. 5,587,333 notes that, for ASICs consisting of standard library cells, the most effective decoupling method is to integrate decoupling capacitors in each such cell, since the noise is managed at the source. This approach makes it easier for the designer as well, who does not have to consider decoupling when cells or blocks from such a library are used.

While the use of decaps is well-known in the art, the prior art designs are so complex that it has heretofore been impossible to optimize the placement and sizing of the decaps in any meaningful way. Previous work on decap allocation and optimization has focused on application in full custom design styles. Existing methods for adding decoupling capacitance are heuristic and local and are therefore wasteful in chip area. For example, the article "Power Supply Noise Aware Floorplanning and Decoupling Capacitance Placement," Zhao et al., 15$^{th}$ International Conference on VLSI Design, describes a linear programming technique for allocation of white space for decap use, and a heuristic is proposed to insert additional white space into an existing floorplan.

In light of the shortcomings of these approaches, it would be desirable to devise an improved method of mathematically determining the right amount of decoupling capacitance needed by a design. It would be further advantageous if the solution could address the circuit as a whole, rather than merely on a local level.

SUMMARY OF THE INVENTION

It is therefore one object of the present invention to provide an improved method of laying out cells in an integrated circuit.

It is another object of the present invention to provide such a method which utilizes decoupling capacitors in the power grid to reduce noise.

It is yet another object of the present invention to provide a method and system for improving the placement and sizing of decoupling capacitors between cells in a row-oriented random logic macro structure.

The foregoing objects are achieved in a method of reducing noise in a power grid of an integrated circuit, generally comprising the steps of locating logic cells in a first layout of the integrated circuit with empty spaces between the adjacent cells, changing the placement of the cells to a second layout wherein the size of the empty spaces between the adjacent cells also changes, and placing decoupling capacitors in the empty spaces of the second layout. In the example of a row-oriented cell structure, the locating step may uniformly distribute the empty spaces in each row for the initial layout. In the preferred implementation, the changing step includes the steps of performing an adjoint sensitivity analysis of the sensitivity of a noise function of the integrated circuit with respect to sizes of the empty spaces between adjacent cells, and convolving an original noise waveform with an adjoint noise waveform. The convolving step may use piecewise linear compressions of the original and adjoint noise waveforms. A quadratic programming solver is then used to iteratively determine the sizes of the empty spaces between adjacent cells.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to a method and system for automated placement and sizing of decoupling capacitors (decaps) in ASIC-like circuits. In the preferred implementation, an adjoint sensitivity method is applied to calculate the first-order sensitivity of the power grid noise with respect to every decap. As explained further below, a fast convolution technique based on piecewise linear compressions of the original and adjoint waveforms is used to optimize placement. Experimental results show that power grid noise can be significantly reduced after a judicious optimization of decap placement, with little change of the total chip area.

Figure 2:
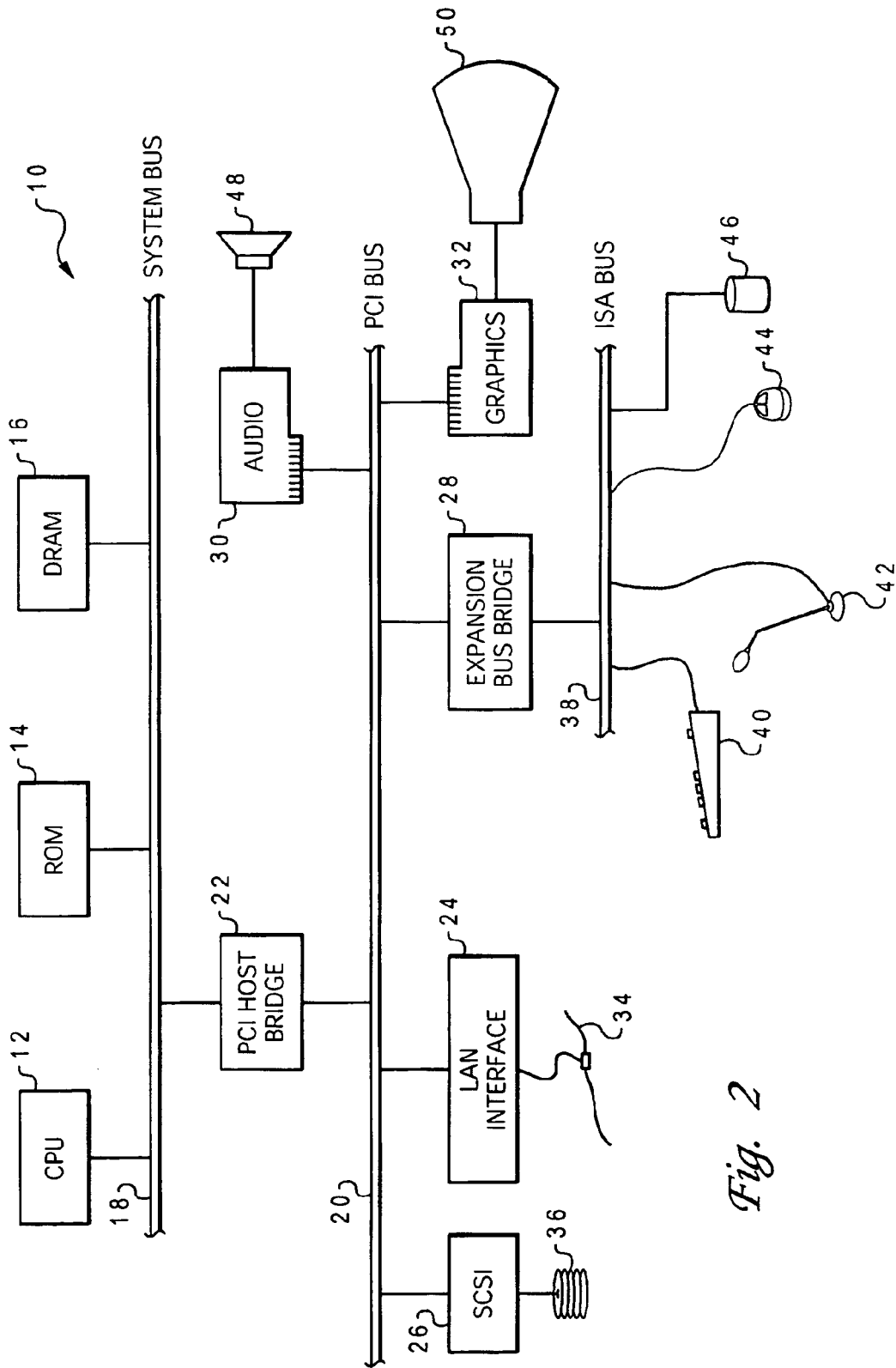
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36 (storage media), those skilled in the art will appreciate that the invention can be embodied in a program product utilizing other computer-readable media, including transmission media.

Computer system 10 carries out program instructions for placement of cells in the design of an integrated circuit, using a novel technique wherein the placement and sizing of decoupling capacitors is optimized. Accordingly, the program may include conventional aspects of various computer-aided design programs, and these details will become apparent to those skilled in the art upon reference to this disclosure.

Figure 3:
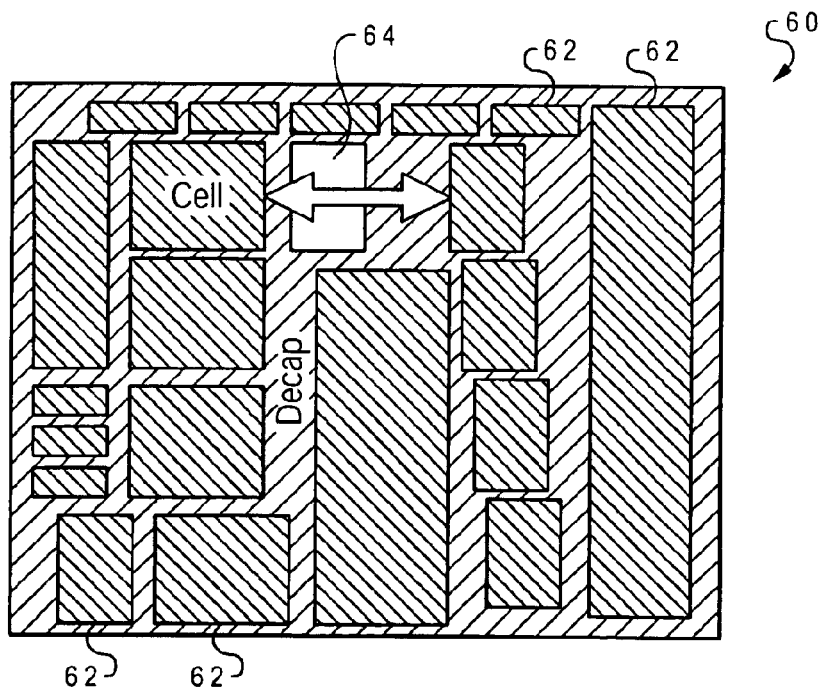
FIG. 3 is a plan view of an integrated circuit, such as a microprocessor, having logic cells arranged in a layout with empty spaces therebetween at which decoupling capacitors are placed.

The invention may be understood with reference to the example of FIG. 3, a simplified plan view of the layout of an integrated circuit 10. In this example, circuit 60 is a reduced instruction set computing (RISC) microprocessor, and includes many cells 62 that provide various functions, such as a bus interface unit, a performance monitor, data and instruction caches, registers, and execution units such as branch units, dispatch units, load/store units, fixed-point units, complex integer units, and floating point units. Assuming that a given block 64 in the design can be moved by a small amount, the question is how it should best be placed in order to locate the empty, "white" spaces (hence, decaps) where they function optimally (or near-optimally) to reduce power supply induced noise.

Figure 4:
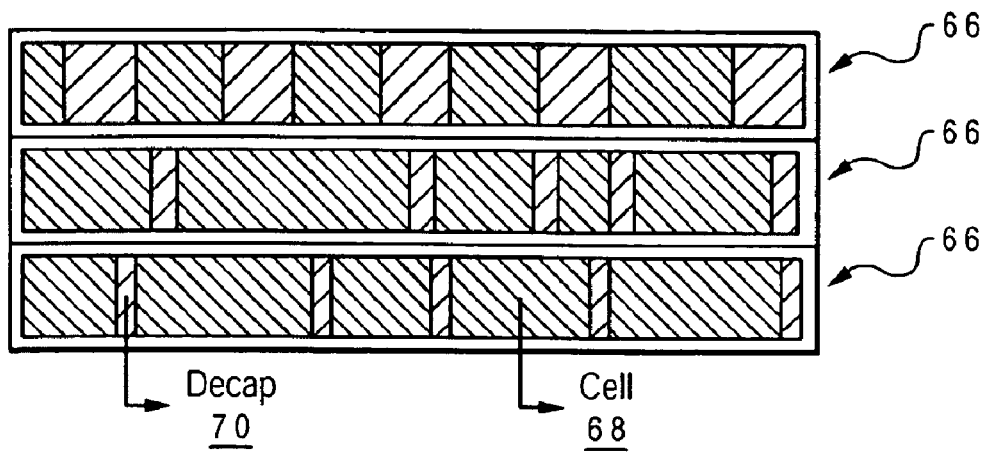
FIG. 4 is a plan view of a row-oriented random logic macro (RLM) structure with cells aligned in rows and empty spaces for decoupling capacitors.

This two-dimensional perspective may be simplified further for the specific problem with random logic macros (RLMs), in which cell-based designs are often implemented in rows. This construction reduces the problem to a one-dimensional optimization. For each cell, an optimum location is determined with the particular row. Three such rows 66 are depicted in FIG. 4. The method of the present invention aims at changing the placement of cells 68 within row-oriented RLM structures such as those shown in FIG. 4 to allow decoupling capacitors 70 to be inserted in between. It determines the placement by setting up an optimization problem which characterizes: (i) as variables, the location and size of every decoupling capacitor; (ii) as performance metric, the total amount of power grid induced noise; and (iii) as an evaluation function, the complete accurate simulation of the RLMs and associated power grid.

The preferred implementation of the present invention is designed to be applicable subsequent to the placement phase of the design, where cells have already been assigned to rows. At the planning level, one can think of the circuit as being composed of a number of blocks. Each block expends a certain amount of power. The power grid is assumed to be fixed, which is typically the case. Empty space is the filled with decoupling capacitance.

Since prior art placement techniques are usually designed to place cells in order to achieve compactness for the layout and to control the wire length, timing and congestion factors, the result of such a prior art placement technique can be used as the starting point for decap optimization of the present invention, and that result is then perturbed in a minimal way during the optimization process. According to this approach, the exact position of each cell in a given row is considered to be flexible, although the order and the relative positions of the cells are fixed. Different placement of cells can lead to different widths (i.e., sizes) and locations of decaps, and consequently different impacts on the power supply noise.

Figure 1:
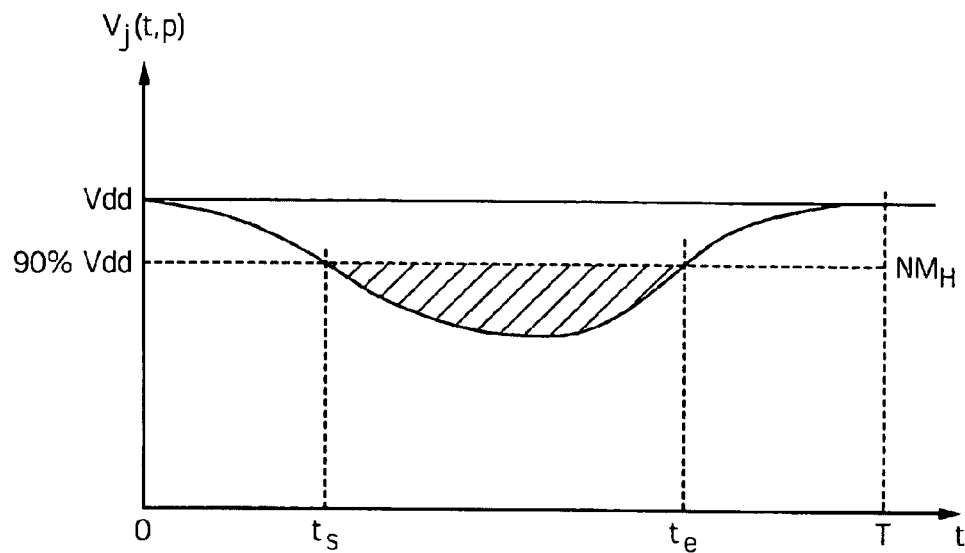
FIG. 1 is a graph illustrating the voltage droop at a given node in the power grid ($V_{dd}$) of a typical application-specific integrated circuit (ASIC)

For the ASIC row-based standard-cell design outlined above, it is common to use a predefined mesh-like power distribution network. The present invention uses a similar network model in which: the power distribution network (grid) is modeled as a resistive mesh; the cells are modeled as time-varying current sources connected between power and ground (each current source waveform is obtained from other tools that determine the worst-case patterns); the decoupling capacitors are modeled as single lumped capacitors connected between power and ground; and the top-level metal is connected to a package modeled as an inductance connected to an ideal constant voltage source. The behavior of such a circuit (ASIC row/cells) can be described by a first order differential equation using modified nodal analysis. After the transient analysis of the circuit, the voltage waveform at every node is known. The noise at each node is estimated by integrating the voltage droop below a user-specific noise ceiling (the shaded area in FIG. 1). The "measure of goodness" for the circuit as a whole is then given as the sum (Z) of the individual node metrics.

Adjoint sensitivity analysis is a standard technique for circuit optimization where the sensitivity of one performance function with respect to many parameter values is required. This technique can be used for the method of the present invention which is interested in the sensitivity of the scalar objective function (the sum Z of the individual node metrics) with respect to the widths (sizes) of all decaps in the network. An adjoint network with the same topology as the original network is constructed, with all of the voltage sources in the original network shorted, and current sources open. The initial conditions for the adjoint circuit are set to zero, and it is analyzed backward in time. The same time step may be used as was used to analyze the behavior of the original circuit. In order to ensure the accuracy of adjoint sensitivities, it is preferable to use 500–1000 steps per clock cycle.

Figure 5:
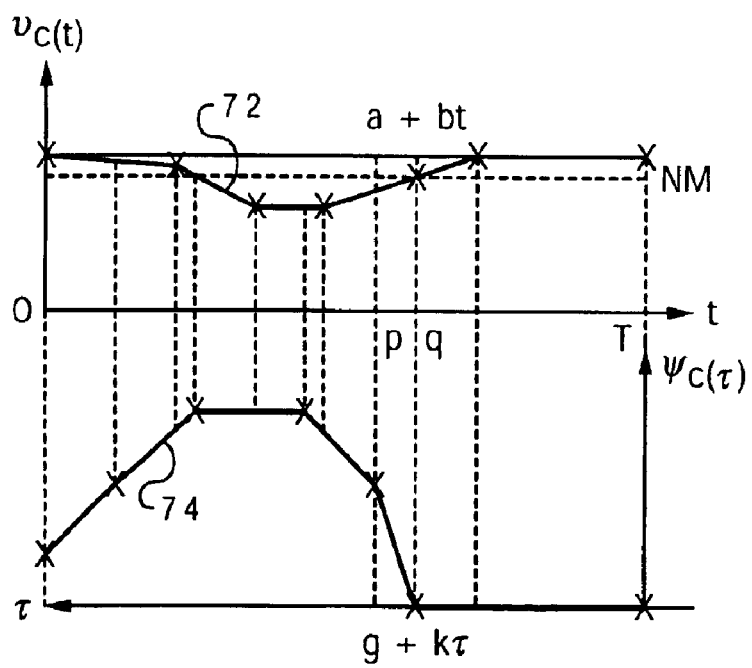
FIG. 5 is a graph depicting the convolution of an original voltage noise waveform with an adjoint noise waveform, according to the present invention.

The sensitivity of the objective function with respect to all of the decoupling capacitors in the circuit can then be computed from the mathematical convolution of the original waveform with the adjoint waveform. In the context of the present invention, this approach is difficult to use directly since a significant complication arises in the case of very large networks where the total amount of data to be stored is proportional to the number of nodes multiplied by the number of time steps, and could reach $10^9$ bytes or more for networks with millions of nodes. To alleviate this problem, the waveforms of the original and adjoint networks can be stored using a compressed piecewise linear form. This technique results in a situation of the type illustrated in FIG. 5, wherein the time points on the original and adjoint waveforms 72, 74 are not aligned. However, since the waveforms are divided by linear segments, the convolution of the two waveforms (where g+kT is the original waveform, and a+bt is the adjoint waveform) over the time interval [p,q] can be expressed as:

$$\int_p^q [g + k(T-t)][d(a+bt)/dt]dt = \int_p^q [g + k(T-t)]bdt$$
$$= b(q-p) \times [g - kT - k(q-p)/2].$$

Once the sensitivities of Z are computed with respect to all of the decoupling capacitor values, the sensitivities to the width (size) of each capacitor can be calculated using the chain rule:

$$\partial Z/\partial w = \partial Z/\partial C \times \partial C/\partial w,$$

where w is the width, and C is the decoupling capacitance. Given that the decoupling capacitance can be calculated from:

$$C = \epsilon_{ox}/T_{ox} \times w \times h,$$

where $\epsilon_{ox}$ is the permittivity of the gate oxide, $T_{ox}$ is the thickness of the gate oxide, and h is the fixed height of the decap, it is easily verified that the sensitivity to the width becomes:

$$\partial Z/\partial w = \partial Z/\partial C \times \epsilon_{ox}/T_{ox} \times h.$$

The problem of decoupling capacitor optimization can then be formulated as minimizing Z as a function of w, while applying feasibility constraints, i.e., the total decap width in a row do not exceed the total amount of empty space in that row, and the decap widths are within a realistic range (the upper bound is the largest empty space in the row, while the lower bound is of each decap width is zero).

These computations may be performed using power grid simulation tools which are appropriately programmed to measure power grid noise at each node in a design. In the illustrative embodiment, the system for carrying out this analysis further utilizes a standard quadratic programming (QP) solver for solving large nonlinear optimization problems. Optimization begins with an initial state which uniformly distributes the vacant space (decap space) in each row, as illustrated in FIG. 4. The initial chip width is chosen to be the maximum width occupied by cells and decaps among all rows. The optimization process repeats several steps iteratively. These are:

- perform transient simulation of the original power grid circuit and store piecewise linear waveforms of all decaps;
- check all nodal voltages for those that fall below the noise margin, identifying hot sports and computing the objective function Z;
- set up the sources corresponding to these failure nodes for the adjoint circuit and store the piecewise linear waveforms of all decaps;
- compute the sensitivities $\partial Z/\partial C$ by convolution, and use the chain rule to obtain $\partial Z/\partial w$;
- compute the constraint function and its Jacobian;
- feed all of this information into a QP solver and update the vector of widths w, according to the values returned by the solver; and
- according to the updated w vector, reposition all of the cells and decaps in the row, from left to right.

In the preferred implementation, there are a maximum of 10 iterations of the QP solver and noise analysis. If the noise margin after a given iteration is less than a present value (for example, one percent), then additional iterations are not necessary.

This optimization and placement scheme has been experimentally integrated into a linear circuit simulator and the QP solver applied, with the results shown in Table 1.

TABLE 1

| Chip | | Bad nodes | Total nodes | V | Z (V × ns) | Total rows | Total decaps | CPU time (min) |
|---|---|---|---|---|---|---|---|---|
| 1 | B | 105 | 974 | 0.193 | 0.121 | 53 | 1964 | 0.9 |
|   | A | 0 |     | 0.176 | 0.000 |    |      |     |
| 2 | B | 80  | 861 | 0.230 | 0.366 | 85 | 3288 | 15.2 |
|   | A | 63  |     | 0.196 | 0.063 |    |      |     |
| 3 | B | 100 | 828 | 0.222 | 0.649 | 132 | 3664 | 12.5 |
|   | A | 70  |     | 0.201 | 0.200 |    |      |     |

B = Before optimization; A = After optimization

Figure 6A:
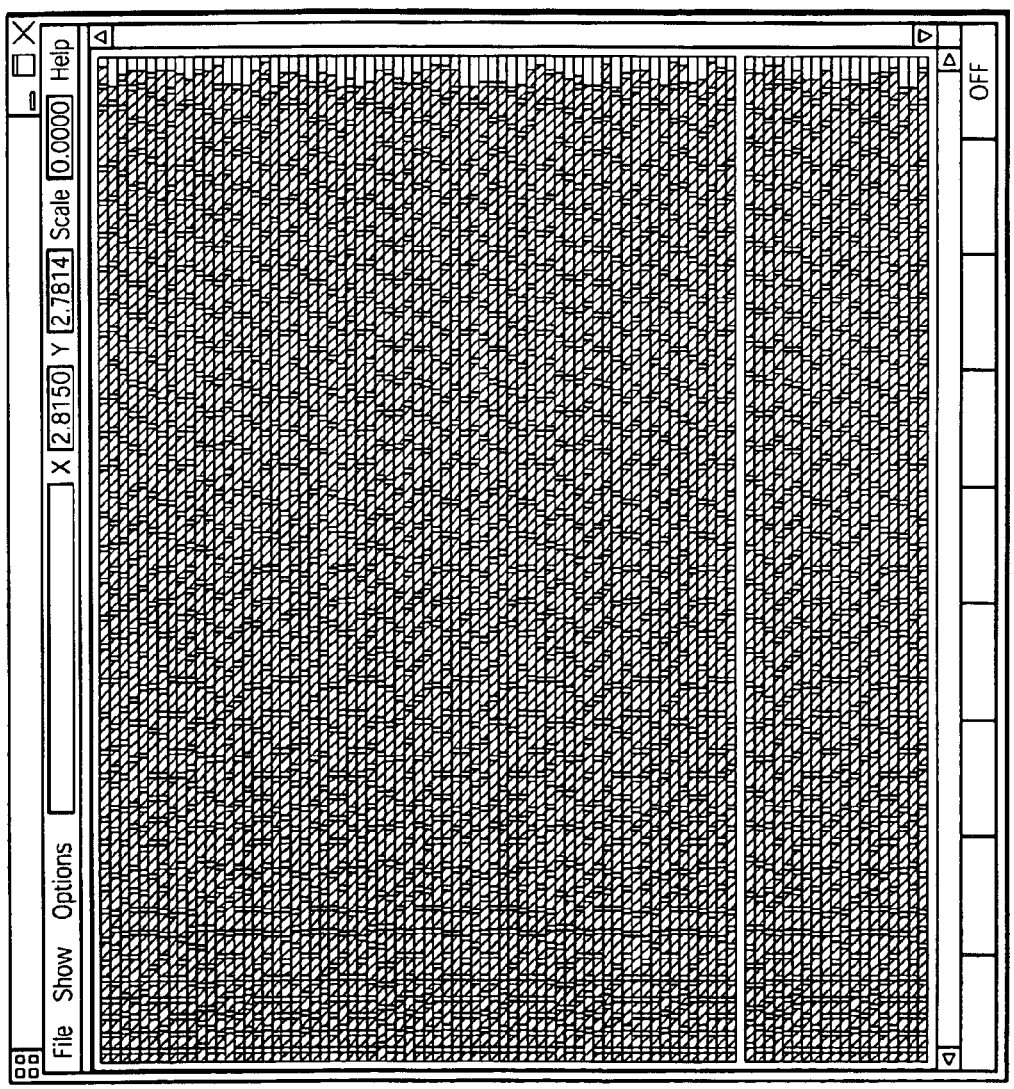
FIGS. 6A and 6B are "before" and "after" plan views of a row-oriented RLM structure in which the placement of decoupling capacitors has been optimized.
Figure 6B:
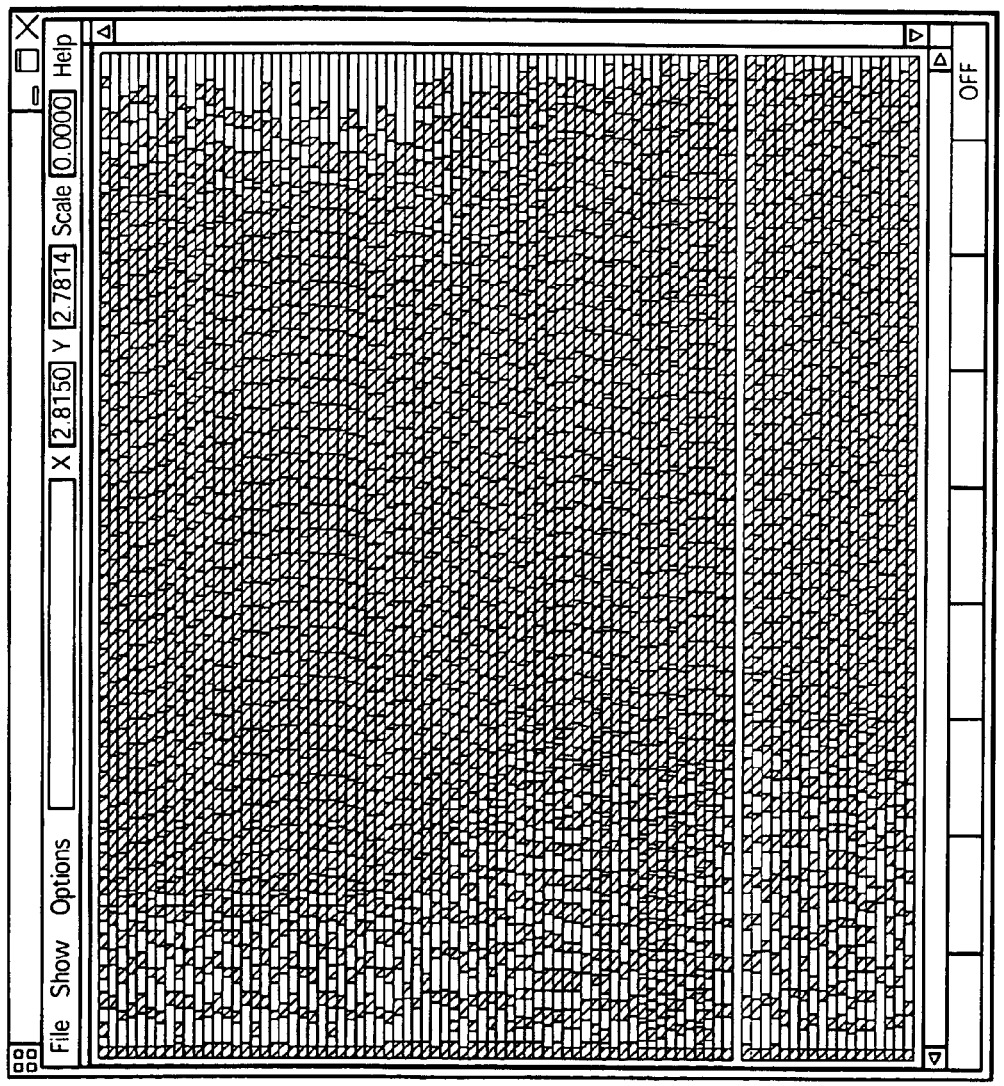

Table 1 lists the decap optimization results for three different industrial ASICs, referred to as Chip 1, Chip 2, and Chip 3. Each of these is a 0.18 μm CMOS design operating under a supply voltage of 1.8 V. The occupancy ratio for each row of these chips is around 80%. Initially (for state B) decaps are uniformly distributed across each row. It can be seen that the number of nodes with noise violations dramatically decreases after optimization. The next two columns compare the worst-case voltage droop and the sum of integral area (Z) before and after optimization. Of the three examples, the worst-case (chip 3) noise reduction is still around one-third of the original value. An example of how a chip might appear before and after optimization is shown in FIGS. 6A and 6B.

Figure 7:
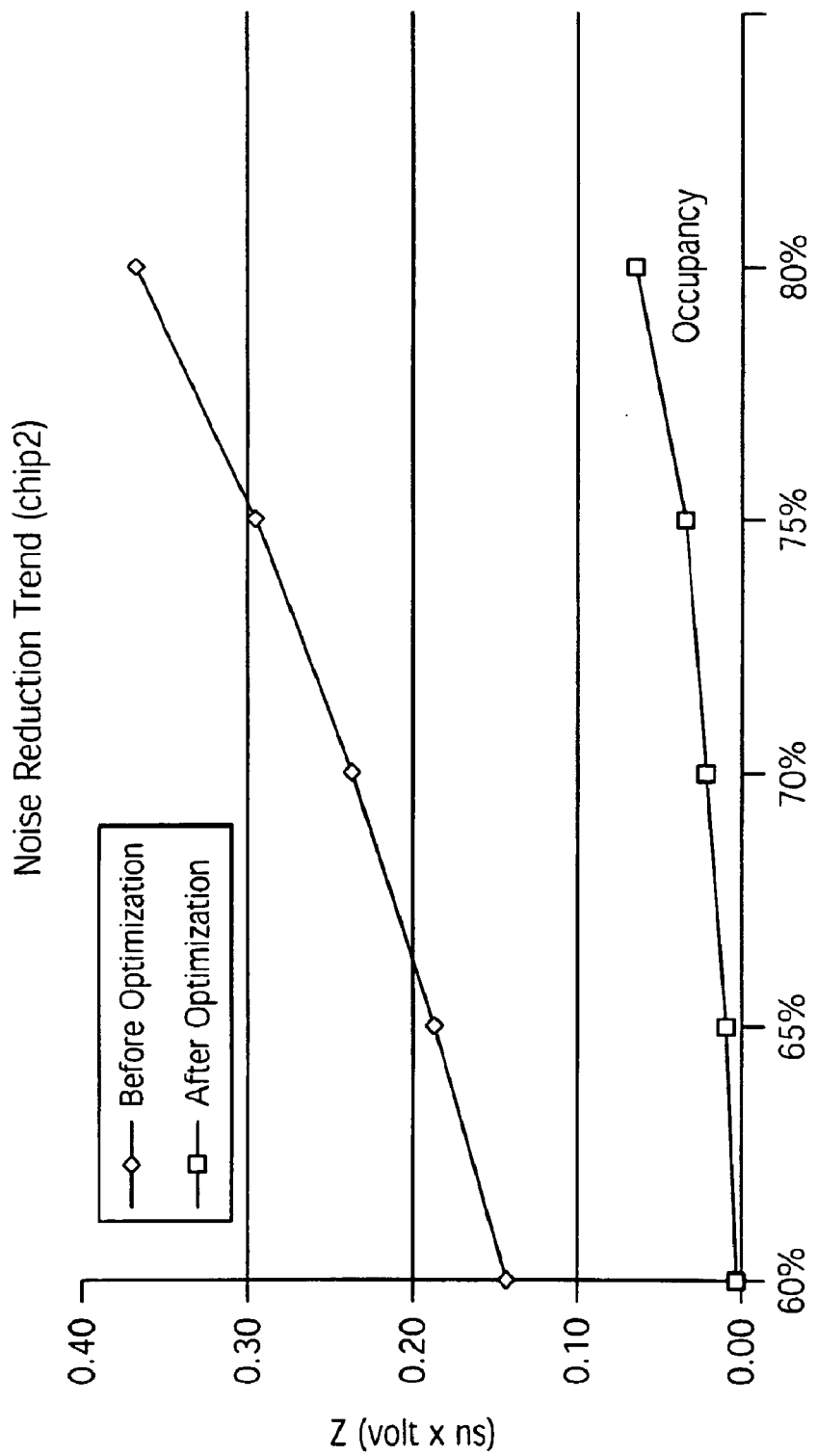
FIG. 7 is a graph illustrating the noise reduction trend with respect to cell occupancy ratio for the present invention.

The noise reduction trend with respect to the cell occupancy ratio for chip 2 is shown graphically in FIG. 7. This experiment is performed by removing some cells from each row of the chip to achieve the desired occupancy ratio. For each case, around 10 percent of the total grid nodes are beyond the noise margin. A chip with lower occupancy ratios provides more empty space for decoupling capacitors and consequently is easier to optimize. Therefore, in FIG. 6, the noise reduction is more efficient for cases with lower occupancy ratios than for those with higher ones.

Additional experimental results of the piecewise linear waveform compression technique are shown in Table 2.

TABLE 2

| Block | Number of decaps | $\epsilon$ | memory (MB) | CPU time (sec) | average error |
|---|---|---|---|---|---|
| 1 | 1964 | 0.0 | 60.7 | 0.66 | 0 |
|   |      | 1e-6 | 14.3 | 0.17 | 0.37 |
| 2 | 3458 | 0.0 | 85.9 | 1.10 | 0 |
|   |      | 1e-6 | 19.8 | 0.30 | 4.6e-3 |
| 3 | 3928 | 0.0 | 93.0 | 1.25 | 0 |
|   |      | 1e-6 | 21.0 | 0.36 | 0.20 |

For each functional block, the total number of decaps are listed in column 2. In column 3, $\epsilon$ is defined as an upper bound for the voltage difference between the actual simulated waveform and the one approximated by the piecewise linear equation. When the difference exceeds $\epsilon$, one breakpoint of the waveform is stored, otherwise the point is removed. When $\epsilon$ is zero, the waveform at every time step is stored and the sensitivity result is the most accurate. Columns 4 and 5 show the total memory and CPU time used during waveforms convolution, while the last column shows the average percentage error of the calculated sensitivities with respect to the accurate values among all decaps in the block. It can be seen that the memory and CPU time reduction are each around 4× in all cases, and the loss in accuracy is always within 0.4%.

The performance tradeoff for various $\epsilon$ values for Block 1 of the experiment is shown in Table 3.

TABLE 3

| $\epsilon$ | memory (MB) | CPU time (sec) | average error % |
|---|---|---|---|
| 0.0 | 60.7 | 0.66 | 0 |
| 1e-6 | 14.3 | 0.17 | 0.37 |
| 1e-5 | 13.9 | 0.16 | 1.12 |
| 1e-4 | 13.4 | 0.14 | 2.66 |
| 1e-3 | 13.2 | 0.13 | 3.14 |
| 1e-2 | 13.1 | 0.13 | 10.4 |

The data show a slightly greater memory and CPU time reduction as $\epsilon$ increases, while the average percentage error of sensitivity goes up 10%.

Those skilled in the art will appreciate that the use of decoupling capacitors is not the only method for noise reduction, and other techniques (such as wire widening, or increasing the density of the power grid) can be applied to further improve the power grid performance.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention is not limited to one specific applications. Exemplary uses include (but are not limited to) memory devices (EEPROM, flash, ROM, RAM, FIFO, CAM, etc.), digital signal processors, microprocessors, bus interfaces, analog-to-digital or digital-to-analog converters, and codecs. It is therefore contemplated that such modifications can be made without departing from the spirit or scope of the present invention as defined in the appended claims

What is claimed is:

1. A method of reducing noise in a power grid of an integrated circuit, comprising the steps of:

locating logic cells in a first layout of the integrated circuit with empty spaces between the adjacent cells;

iteratively changing the placement of the cells to a second layout wherein the size of the empty spaces between the adjacent cells also changes, said changing step including the steps of performing an adjoint sensitivity analysis of the sensitivity of a noise function of the integrated circuit with respect to sizes of the empty spaces between adjacent cells, and convolving an original noise waveform with an adjoint noise waveform; and placing decoupling capacitors in the empty spaces of the second layout to reduce power-induced noise.

2. The method of claim 1 wherein said convolving step uses piecewise linear compressions of the original and adjoint noise waveforms.

3. The method of claim 2 wherein said changing step further utilizes a quadratic programming solver to iteratively determine the sizes of the empty spaces between adjacent cells.

4. The method of claim 1 wherein the integrated circuit is a row-oriented cell structure, and said locating step uniformly distributes the empty spaces in each row for the initial layout.

5. A data processing system for laying out decoupling capacitors in an integrated circuit design, comprising:

means for processing program instructions;

a memory device connected to said processing means; and program instructions residing in said memory device for locating logic cells in a first layout of the integrated circuit with empty spaces between the adjacent cells, iteratively changing the placement of the cells to a second layout wherein the size of the empty spaces between the adjacent cells also changes, performing an adjoint sensitivity analysis of the sensitivity of a noise function of the integrated circuit with respect to sizes of the empty spaces between adjacent cells, convolving an original noise waveform with an adjoint noise waveform, and placing decoupling capacitors in the empty spaces of the second layout to reduce power-induced noise.

6. The data processing system of claim 5 wherein said program instructions further use piecewise linear compressions of the original and adjoint noise waveforms.

7. The data processing system of claim 6 wherein said program instructions further utilize a quadratic programming solver to iteratively determine the sizes of the empty spaces between adjacent cells.

8. The data processing system of claim 5 wherein the integrated circuit is a row-oriented cell structure, and said locating step uniformly distributes the empty spaces in each row for the initial layout.

9. A computer program product comprising:

a computer-readable medium; and program instructions residing in said medium for locating logic cells in a first layout of the integrated circuit with empty spaces between the adjacent cells, iteratively changing the placement of the cells to a second layout wherein the size of the empty spaces between the adjacent cells also changes, performing an adjoint sensitivity analysis of the sensitivity of a noise function of the integrated circuit with respect to sizes of the empty spaces between adjacent cells, convolving an original noise waveform with an adjoint noise waveform, and placing decoupling capacitors in the empty spaces of the second layout to reduce power-induced noise.

10. The computer program product of claim 9 wherein said program instructions further use piecewise linear compressions of the original and adjoint noise waveforms.

11. The computer program product of claim 10 wherein said program instructions further utilize a quadratic programming solver to iteratively determine the sizes of the empty spaces between adjacent cells.

12. The computer program product of claim 9 wherein the integrated circuit is a row-oriented cell structure, and said locating step uniformly distributes the empty spaces in each row for the initial layout.

* * * * *